(12) United States Patent
Tuli

(10) Patent No.: US 9,234,681 B2
(45) Date of Patent: Jan. 12, 2016

(54) METHOD FOR DESIGNING AND BUILDING REFLECTORS FOR A SOLAR CONCENTRATOR ARRAY

(76) Inventor: Raja Singh Tuli, Montreal (CA)

(*) Notice: Subject to any disclaimer, the term of this patent is extended or adjusted under 35 U.S.C. 154(b) by 537 days.

(21) Appl. No.: 12/692,050

(22) Filed: Jan. 22, 2010

(65) Prior Publication Data

US 2011/0088246 A1 Apr. 21, 2011

Related U.S. Application Data

(63) Continuation-in-part of application No. 12/580,251, filed on Oct. 16, 2009.

(51) Int. Cl.
| | |
|---|---|
| *B23P 15/26* | (2006.01) |
| *F24J 2/18* | (2006.01) |
| *F24J 2/10* | (2006.01) |
| *F24J 2/38* | (2014.01) |
| *F24J 2/54* | (2006.01) |
| *H01L 31/054* | (2014.01) |

(52) U.S. Cl.
CPC ........ *F24J 2/18* (2013.01); *F24J 2/1047* (2013.01); *F24J 2/38* (2013.01); *F24J 2/5431* (2013.01); *H01L 31/0547* (2014.12); *Y02B 10/10* (2013.01); *Y02B 10/20* (2013.01); *Y02E 10/47* (2013.01); *Y02E 10/52* (2013.01); *Y10T 29/49* (2015.01); *Y10T 29/49355* (2015.01)

(58) Field of Classification Search
CPC ..... F24J 2002/1085; F24J 2/18; F24J 2/4638; Y02E 10/40; Y02B 10/20; Y10T 29/49355; Y10T 29/49
USPC ............ 29/890.033, 592; 126/573, 685, 621, 126/680, 686, 688, 600, 681, 683, 684, 126/714; 250/203.4; 60/641.8, 641.11, 60/641.15; 136/246, 248
See application file for complete search history.

(56) References Cited

U.S. PATENT DOCUMENTS

| | | | |
|---|---|---|---|
| 3,118,437 | A | 1/1964 | Hunt |
| 4,065,053 | A | 12/1977 | Fletcher et al. |
| 4,131,336 | A | 12/1978 | Frosch |
| 4,148,301 | A | 4/1979 | Cluff |
| 4,149,521 | A | 4/1979 | Fletcher et al. |

(Continued)

FOREIGN PATENT DOCUMENTS

| | | |
|---|---|---|
| JP | 5997460 A | 6/1984 |
| WO | 2005/022047 A2 | 3/2005 |
| WO | 2008/046187 A1 | 4/2008 |

OTHER PUBLICATIONS

English language abstract of JP5997460A.

*Primary Examiner* — Peter DungBa Vo
*Assistant Examiner* — Azm Parvez
(74) *Attorney, Agent, or Firm* — Goudreau Gage Dubuc; Hugh Mansfield

(57) ABSTRACT

The present invention discloses further improvement of the shape and disposition of the optical reflecting elements that make up the primary concentrating reflector and the secondary redirecting reflector disclosed in U.S. application Ser. No. 12/580,251 (Solar Energy Concentrator) filed by the same Inventor. In one aspect, it discloses a method for designing and building reflectors for a solar concentrator array comprising primary and secondary reflectors wherein the multiple components cooperate to continually concentrate the incoming solar radiation on a remote stationary absorber as the sun runs its course across the sky.

17 Claims, 19 Drawing Sheets

(56) References Cited

U.S. PATENT DOCUMENTS

| | | |
|---|---|---|
| 4,194,850 A | 3/1980 | Cranmore |
| 4,195,620 A | 4/1980 | Rust |
| 4,350,412 A | 9/1982 | Steenblik et al. |
| 4,552,126 A | 11/1985 | Boyd |
| 4,561,425 A | 12/1985 | Long et al. |
| 4,590,920 A | 5/1986 | Sainsbury |
| 5,002,379 A | 3/1991 | Murtha |
| 5,374,317 A | 12/1994 | Lamb et al. |
| 5,529,054 A * | 6/1996 | Shoen .......................... 126/681 |
| 5,578,140 A * | 11/1996 | Yogev et al. ................. 136/246 |
| 6,217,199 B1 | 4/2001 | Lo et al. |
| 6,530,369 B1 | 3/2003 | Yogev et al. |
| 7,192,146 B2 | 3/2007 | Gross et al. |
| 7,677,241 B2 | 3/2010 | Hickerson |
| 7,923,624 B2 * | 4/2011 | Borton .......................... 136/246 |
| 2008/0230049 A1 | 9/2008 | Dol |
| 2009/0229264 A1 | 9/2009 | Gilon |
| 2010/0101560 A1 | 4/2010 | Olsson et al. |
| 2011/0067688 A1 | 3/2011 | Reif et al. |

\* cited by examiner

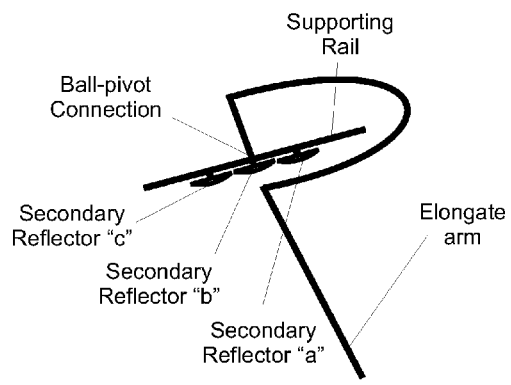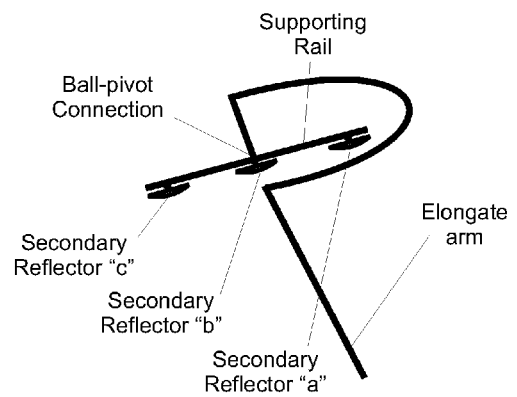
Fig.13  Fig.14
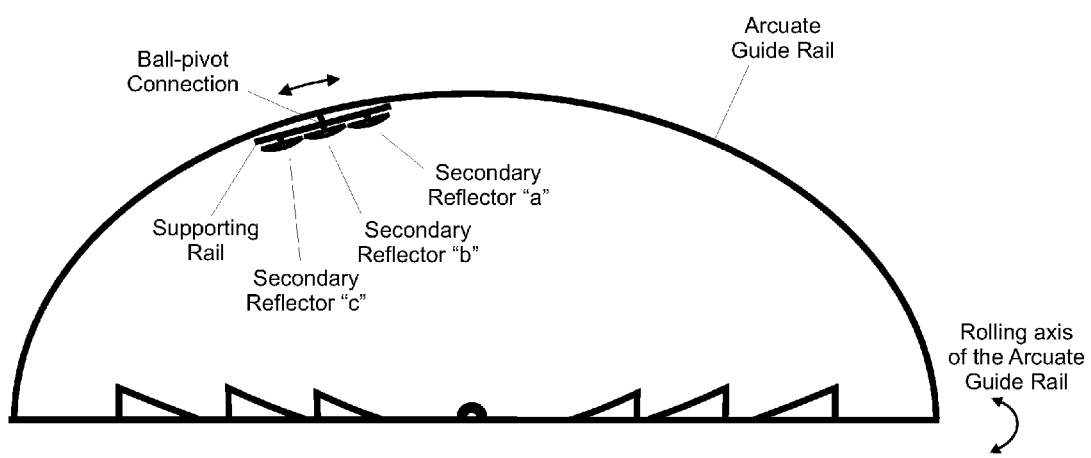
Fig.15

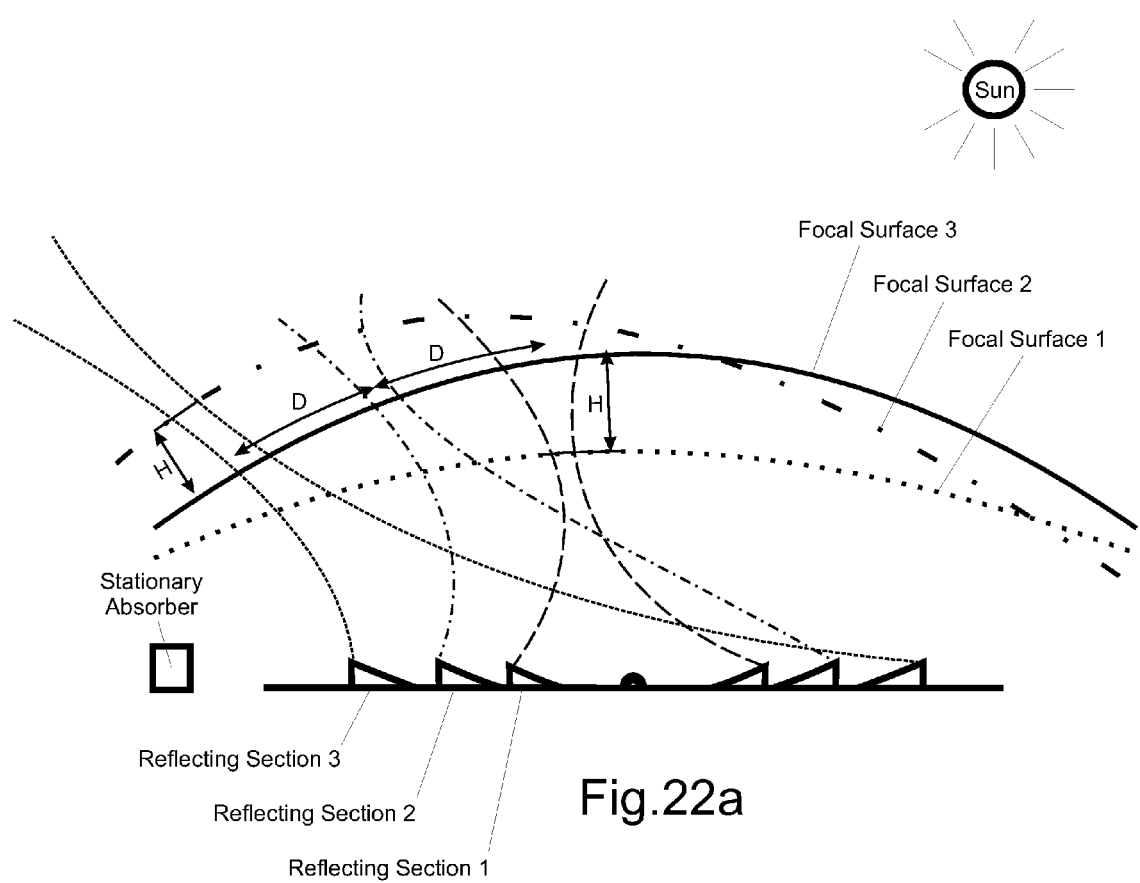

METHOD FOR DESIGNING AND BUILDING REFLECTORS FOR A SOLAR CONCENTRATOR ARRAY

The present invention is a continuation-in-part of U.S. application Ser. No. 12/580,251 (Solar Energy Concentrator) filed by the same Inventor.

FIELD OF THE INVENTION

It addresses further improvement of the shape and disposition of the optical reflecting elements that make up the primary concentrating reflector and the secondary redirecting reflector disclosed in said previous patent application.

BRIEF DESCRIPTION OF THE DRAWINGS

A more complete understanding of the present invention may be had by reference to the following detailed description when taken in conjunction with the accompanying drawings, wherein:

FIG. 13 is a side elevation view of an embodiment of the present invention illustrating a first view of an optional embodiment of the present invention with three separate secondary reflectors "a", "b" and "c" that are slidably attached to a supporting rail that is ball-pivotally connected to the distal end of the elongate supporting arm;

FIG. 14 is a side elevation view of an embodiment of the present invention illustrating a second view of an optional embodiment of the present invention with three separate secondary reflectors "a", "b" and "c" that are slidably attached to a supporting rail that is ball-pivotally connected to the distal end of the elongate supporting arm;

FIG. 15 is a side elevation view of an alternative embodiment of the present invention illustrating a rolling arcuate guide rail supporting the supporting rail over which the three separate secondary reflectors "a", "b" and "c" slide;

FIG. 22a is a side elevation view of an embodiment of the present invention illustrating the same elements of FIG. 22, plus the three different focal surfaces corresponding to each of the individually shaped reflecting sections 1, 2 and 3;

DETAILED DESCRIPTION

Figure 1:
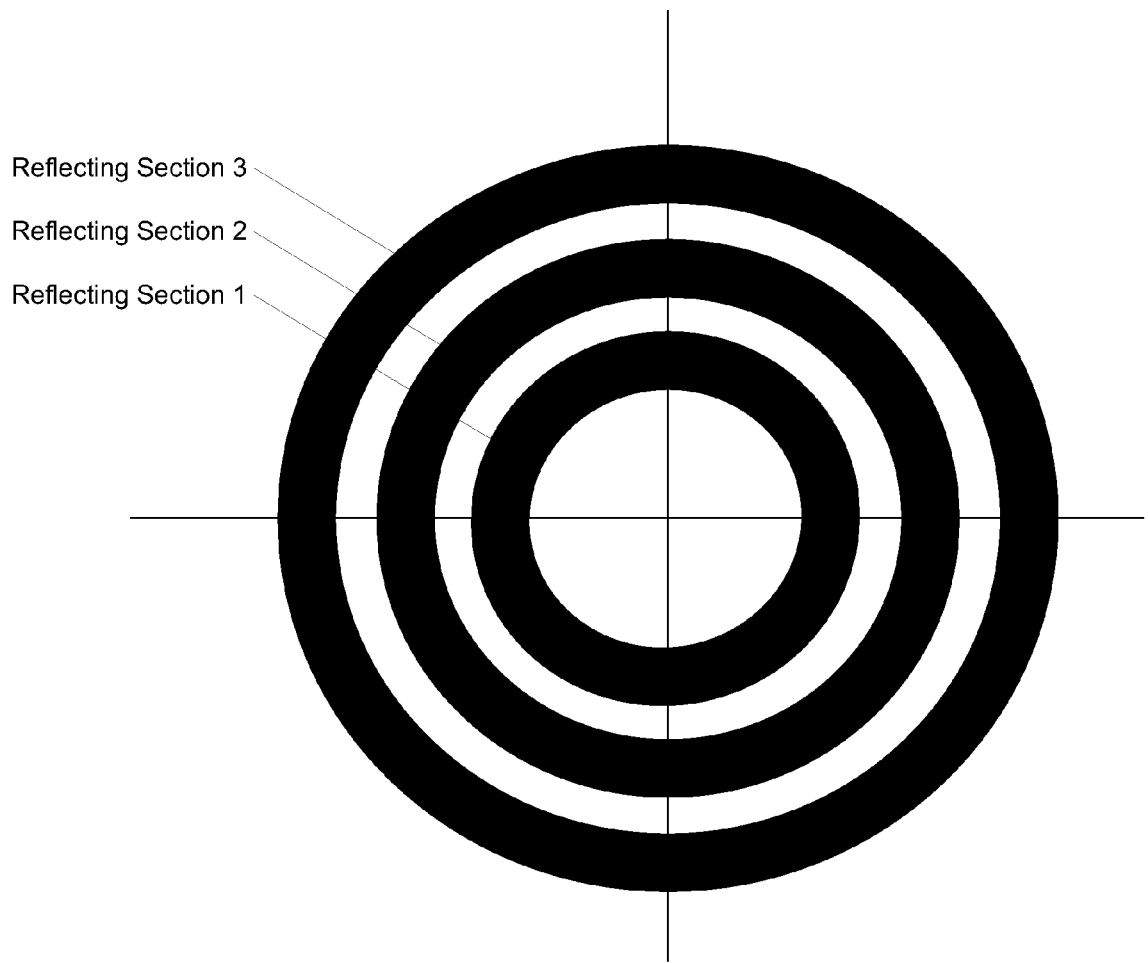
FIG. 1 is a top plan view of an exemplary arrangement of the primary concentrating reflector according to the present invention.
Figure 2:
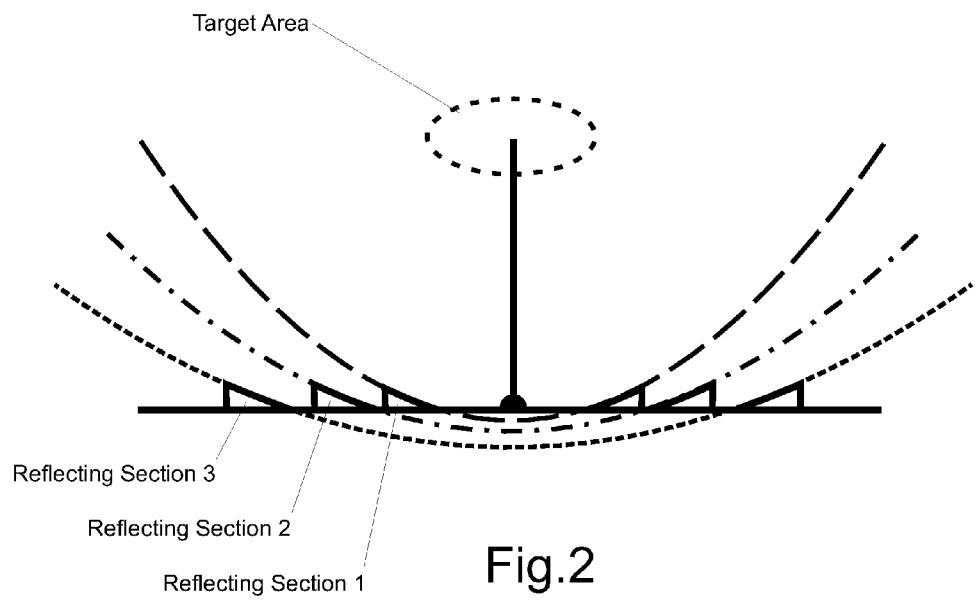
FIG. 2 is a side elevation, cross-sectional view of an exemplary arrangement of the primary concentrating reflector according to the present invention.
Figure 2A:
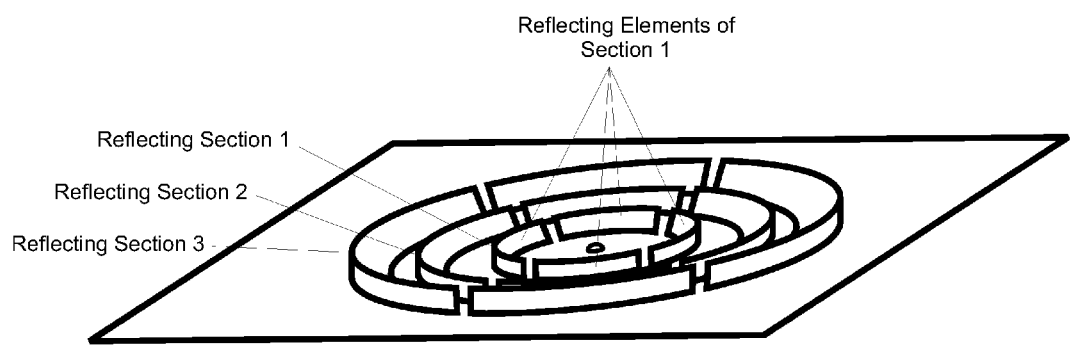
FIG. 2a is a perspective view of an embodiment of the primary concentrating reflector where the reflecting sections 1, 2 and 3 are subdivided into a plurality of cooperating reflector elements.

The primary concentrating reflector array is made up of multiple reflecting surfaces that are stationary with respect to earth. Each of these individual reflecting surfaces that make up the primary concentrating reflector can be identified as a section of a parabola in a first embodiment. For the sake of simplicity in this description, we will discuss an exemplary primary concentrating reflector wherein there are three of said reflecting surfaces, which in a plan view are seen as concentric circles hereinafter designated reflecting sections 1, 2 and 3. Of course a different number and shape of reflecting sections is possible for the primary concentrating reflector, as those versed in the art will readily understand. The exemplary arrangement is illustrated in a plan view as FIG. 1 and in a side elevation, cross-sectional view as FIG. 2. Furthermore, each one of said reflecting sections 1, 2 and 3 may be itself subdivided in a plurality of individual reflecting elements, wherein said plurality of individual reflecting elements cooperate to redirect the incident solar radiation towards a small primary target area that is associated with each one of said reflecting sections 1, 2 and 3. In other words, although the primary concentrating reflector array of the present invention may comprise a large number of individual reflecting elements, these are grouped into a smaller number of reflecting sections where said grouped reflecting elements cooperate for redirecting the incident solar radiation towards a small primary target area which is characteristic of that particular reflecting section. An embodiment where the reflecting sections 1, 2 and 3 are subdivided into a plurality of cooperating reflector elements is illustrated in FIG. 2a. The plurality of individual reflecting elements cooperates to achieve the same optical effect of the corresponding continuous reflecting section.

According to the present invention, a secondary redirecting reflector is positioned near the small primary target areas corresponding to the reflecting sections 1, 2 and 3 for redirecting the light concentrated by the latter towards a stationary remote absorber.

Now let us analyze and discuss the geometric aspects of the path followed by light that originates from the sun, reflects on the primary concentrating reflector array and is redirected towards a primary target area. Each of the individual reflecting sections 1, 2 and 3 reflects the incoming solar radiation according to the geometric optical principles known in the art. More specifically, each individual reflecting section behaves like a parabolic mirror section (even when it is subdivided into a plurality of individual reflecting elements), redirecting the incoming solar radiation according to the incidence angle and the curvature of its parabolic cross-section at the point of incidence. Given the distance from the sun to the reflecting sections 1, 2 and 3 it can be safely assumed that the solar rays are almost perfectly parallel upon reaching the reflective surface.

After reflection by the concave parabolic surface of each of the individual reflecting sections 1, 2 and 3, the solar rays—which had been parallel before reaching the reflector—are convergent towards a narrow area of focus. The spatial location of said narrow area of focus varies according to the position of the sun regarding each of the individual reflecting sections 1, 2 and 3. In other words, incoming parallel light is brought to a substantially narrow area of focus for most angles of incidence of the sunlight onto each of the individual reflecting sections 1, 2 and 3, although the fact that the latter are fixed causes the location and size of said area of focus to vary with the solar incidence angle. This positional variation is addressed by the present invention's movable deployment of the secondary redirecting reflector, which will be described further down.

Figure 3:
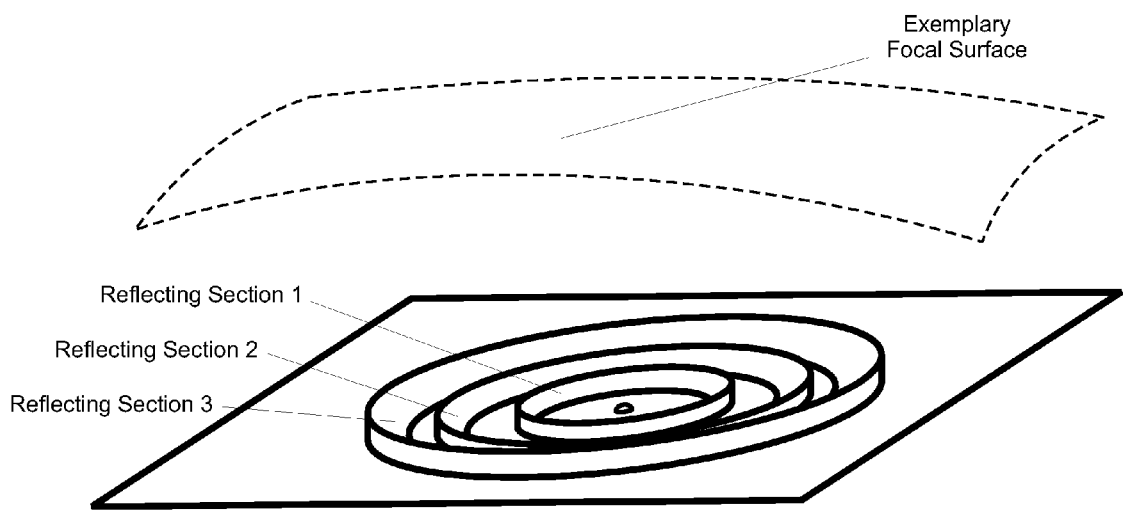
FIG. 3 is a perspective view of an embodiment of the primary concentrating reflector illustrating an exemplary focal surface, associated with the sun's daily and seasonal movement across sky; said surface being unique for each individually shaped reflecting section 1, 2 or 3.
Figure 4:
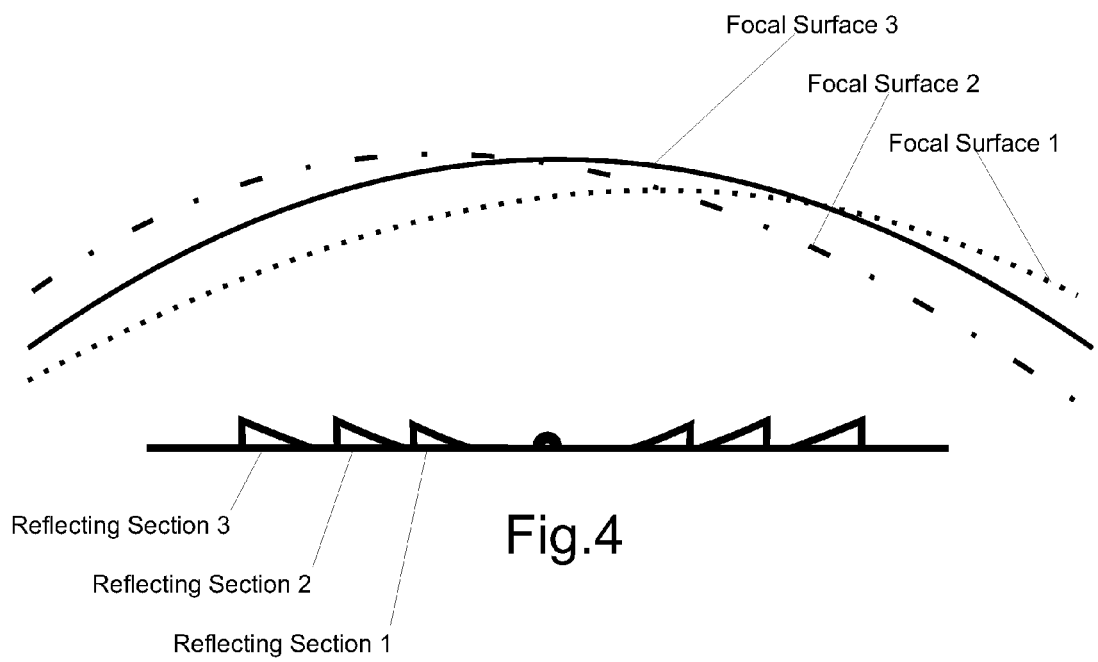
FIG. 4 is a side elevation view of an embodiment of the present invention illustrating a first example of multiple focal surfaces corresponding to each of the individually shaped reflecting sections 1, 2 and 3.
Figure 5:
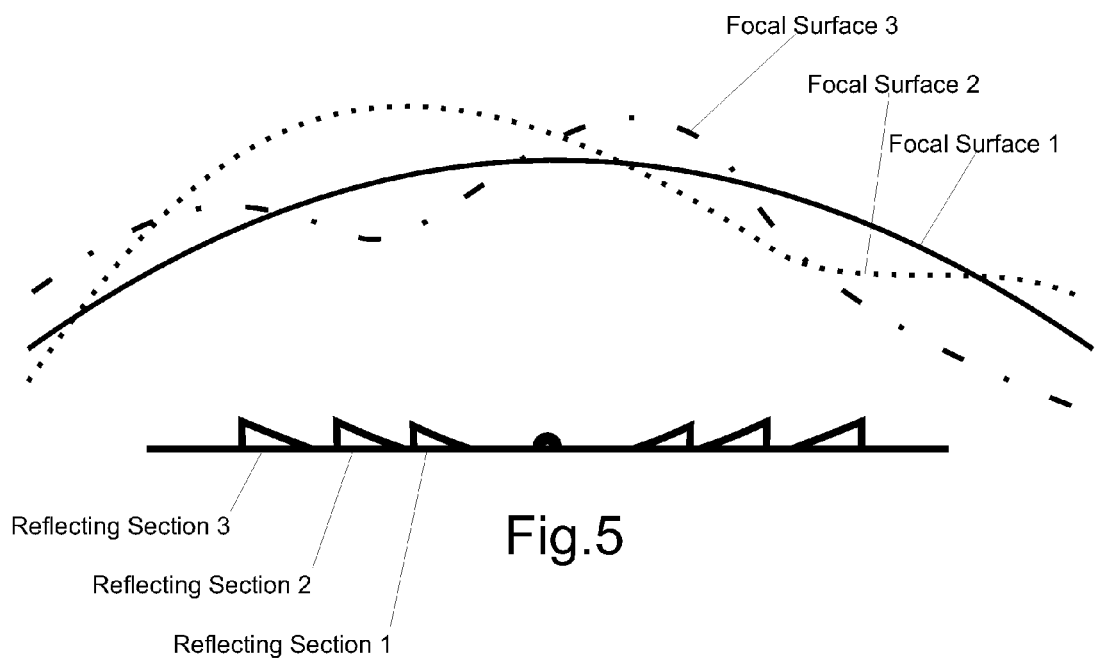
FIG. 5 is a side elevation view of an embodiment of the present invention illustrating a second example of multiple focal surfaces corresponding to each of the individually shaped reflecting sections 1, 2 and 3.

The imaginary connection between the various, successive positions occupied in the sky by said narrow area of focus corresponding to one particular reflecting section according to the various corresponding positions of the sun generates a curve. Given the combination of the sun's daily and seasonal movement across sky, said curve becomes a surface—a section of an essentially curved surface, such as the exemplary focal surface illustrated on FIG. 3. Much of the discussion presented herein involves the positioning of said imaginary surface, which again is unique for each individually shaped reflecting section 1, 2 or 3. Again for the sake of language simplicity, each of said imaginary surfaces will be the hereinafter designated the focal surface corresponding to each of the individually shaped reflecting sections 1, 2 and 3. These can be seen in FIG. 4. Optionally these focal surfaces could have different shapes which would cause them to intercept each other along several edges such as illustrated on FIG. 5. It should be noted that the optional embodiment wherein each of the reflecting sections 1, 2 and 3 is itself subdivided into a plurality of individual reflecting elements does not affect the rationale exposed herein, as their effect is the same, because said plurality of individual reflecting elements cooperate to redirect the incident solar radiation towards a small primary target area identical to the one that would be generated if the corresponding reflecting section was one continuous surface.

It is important to observe that the particular shape, dimension and spatial positioning of the focal surface corresponding to each of the individually shaped reflecting sections 1, 2 and 3 can be precisely anticipated and adjusted by criterious design of each of the reflecting sections 1, 2 and 3 according to well known principles of optical geometry.

One of the design reasons for splitting the primary concentrating reflector into multiple reflecting surfaces is to reduce its size and make it possible to lay the otherwise bulky primary reflector, for instance, over a two-dimensional flat plane surface—which is advantageous for construction reasons as discussed in the previous patent application U.S. Ser. No. 12/580,251. The split into multiple reflecting surfaces—the reflecting sections 1, 2 and 3 in our illustrative example—brings up the need for designing said individual sections to have different focal surfaces. The spatial positioning of these three different focal surfaces, as well as the relative positions between them, is core to achieving the purposes of the present invention. It is worth pointing out that the surface over which the primary concentrating reflector is laid is not limited to two-dimensional, flat plane surfaces—it may be laid over a non-flat surface without compromising any of the advantages of the present invention.

The problem to be solved by the present invention is keeping the secondary redirecting reflector as small as possible, while at the same time ensuring that most of the solar radiation incident on the primary concentrating reflector array is continually focused on the stationary absorber as the sun runs its course across the sky.

Before we proceed with the description of the embodiments proposed in the present invention, it is important to define the operational working range of the solar concentrator system. It contemplates the fact that for some solar incidence angles—most notably the very shallow ones—the amount of energy collected by the primary concentrator array is much smaller than that collected during periods when the sun is higher up in the sky. Although still within the geometric working range of the structural element that supports and moves the secondary redirecting reflector to adjust for the solar movement, the solar incidence angles beyond said operational working range result in the primary concentrator array not collecting enough energy to justify the operation, and the solar concentrator is shut off whenever said support element reaches the limits of said operational working range, switching back on upon re-entering the operational working range on the next solar cycle.

As described in U.S. application Ser. No. 12/580,251, the structural element that supports and moves the secondary redirecting reflector to adjust for the solar movement is an elongate supporting arm. It is movable in such a manner that allows the continuous repositioning of said secondary reflector (which is positioned at the top end of this elongate supporting arm) so as to track the apparent movement of the sun across the sky.

In one alternative embodiment of the present invention, the elongated arm is telescopic, such that it extends and shortens its axial length to adjust the distance between its proximal and distal ends as required.

Figure 6:
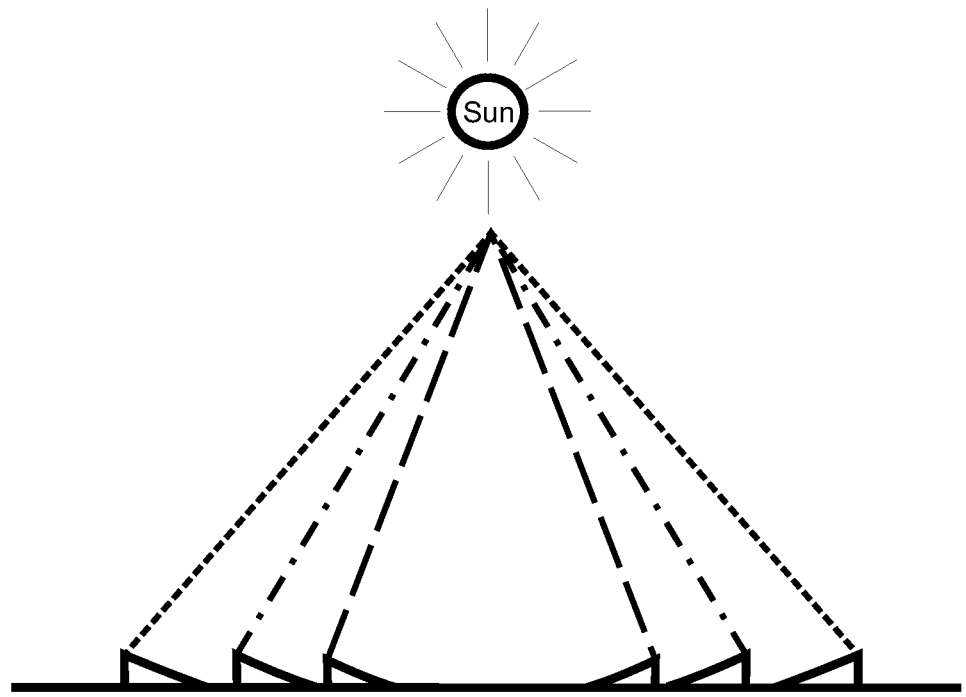
FIG. 6 is a side elevation view of an embodiment of the present invention illustrating the arrangement of the primary reflecting sections with the sun in a zenithal position.
Figure 7:
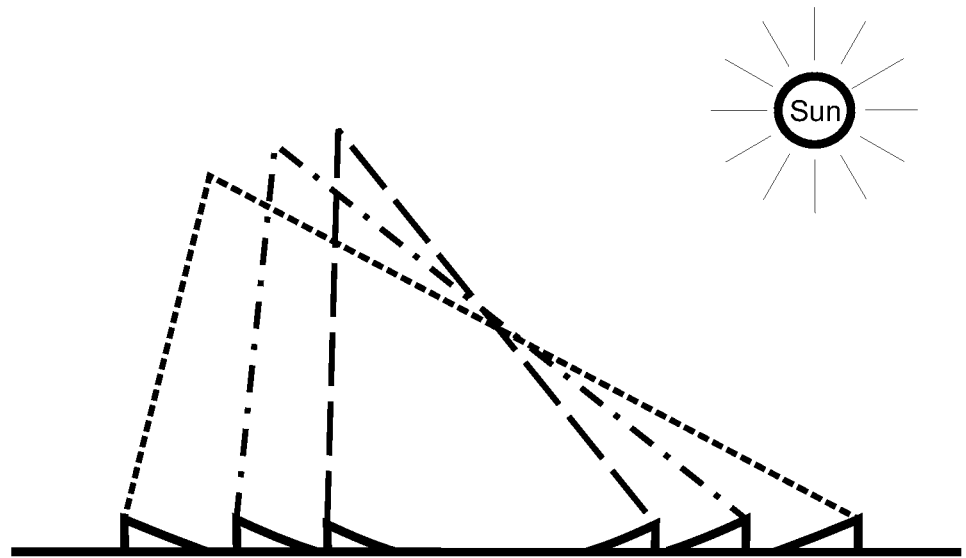
FIG. 7 is a side elevation view of an embodiment of the present invention illustrating the arrangement of the primary reflecting sections with the sun in a non-zenithal position.
Figure 8:
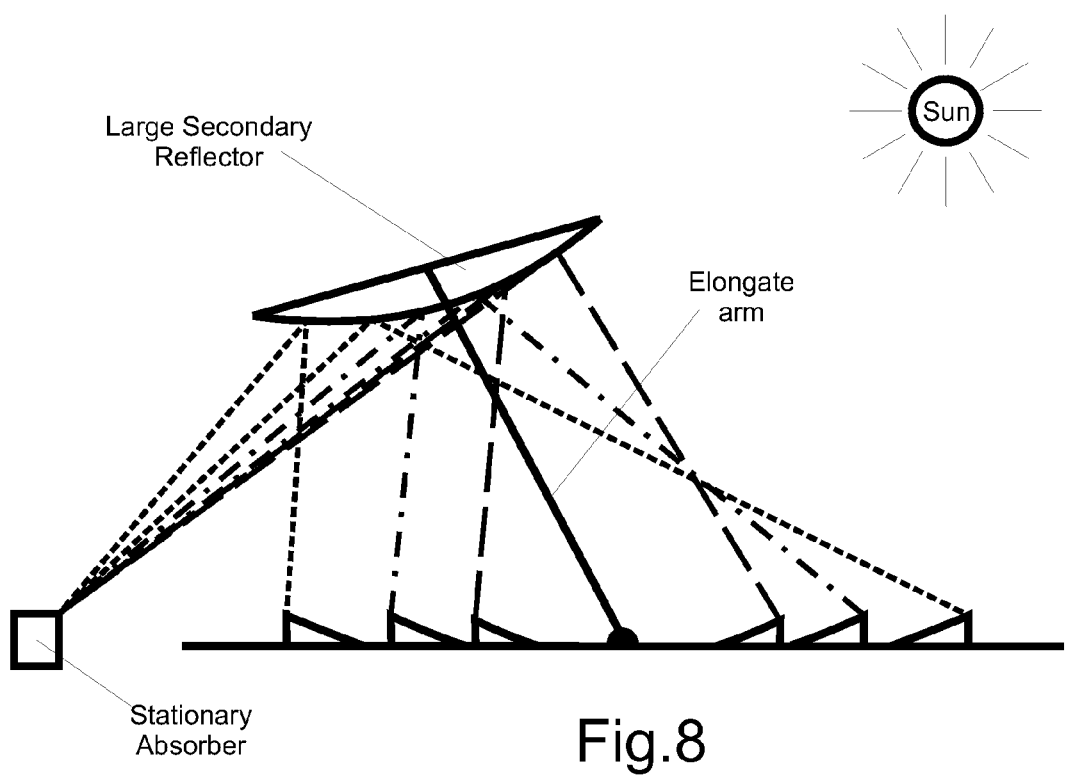
FIG. 8 is a side elevation view of an embodiment of the present invention illustrating a hypothetical arrangement wherein the secondary redirecting reflector would have to be quite large to cope with the situation illustrated on FIG.

Now let us look at the exemplary situations illustrated by FIGS. 6 and 7. In the situation illustrated on FIG. 6 (herein termed zenithal position), the sun is positioned such that the narrow areas of focus corresponding to each of the reflecting sections 1, 2 and 3 occupy the same place in space. In contrast, in the situation illustrated on FIG. 7, the sun is positioned at a different position in the sky and consequently the narrow areas of focus corresponding to each of the reflecting sections 1, 2 and 3 occupy different places—they "separate" when compared to the situation illustrated in FIG. 6. In order to redirect the solar radiation incident on all three reflecting sections 1, 2 and 3, the secondary redirecting reflector would have to be quite large (see FIG. 8), which is part of what the present invention seeks to avoid.

Three different embodiments are herein disclosed for the problem specified above. Each will be described and discussed separately.

Embodiment #1

Figure 9:
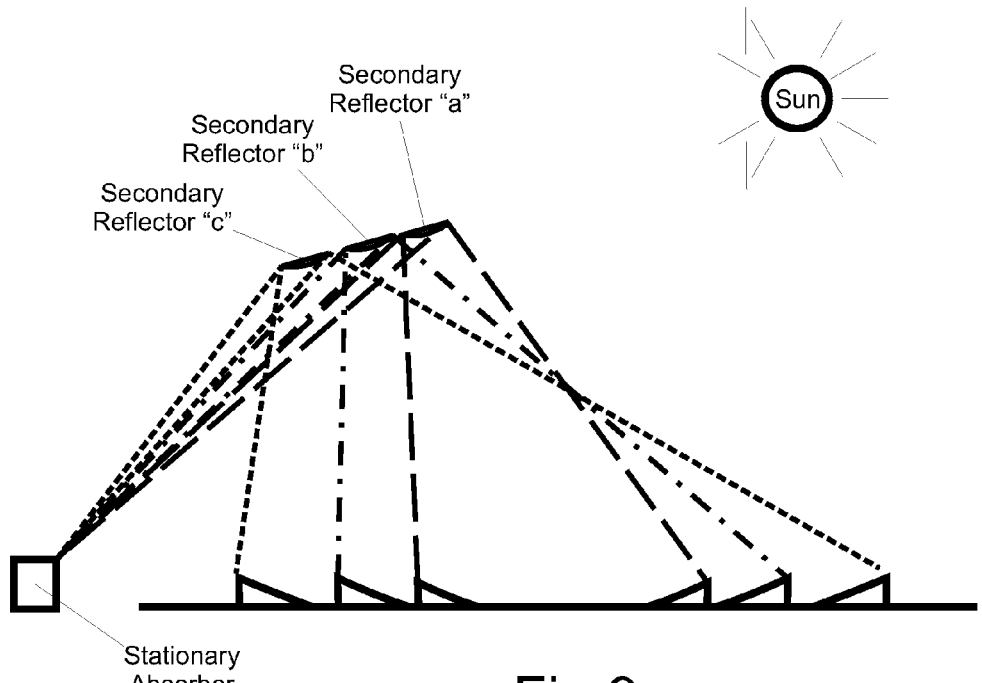
FIG. 9 is a side elevation view of an embodiment of the present invention illustrating a first angular situation wherein the radiation coming from each of the reflecting sections 1, 2 and 3 is redirected towards the stationary absorber.
Figure 10:
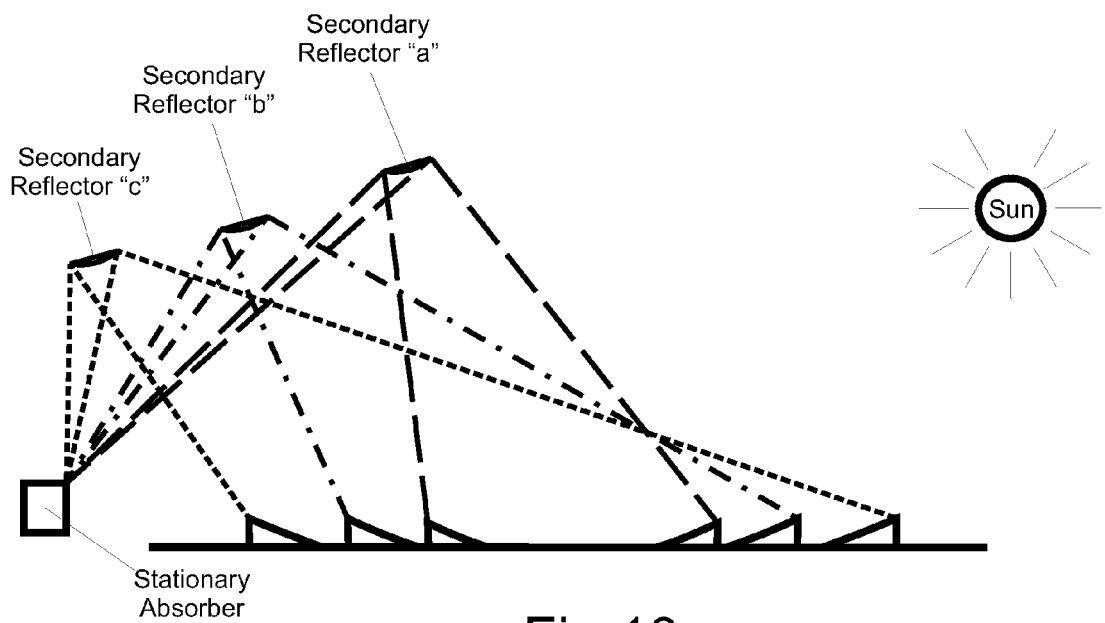
FIG. 10 is a side elevation view of an embodiment of the present invention illustrating a second angular situation wherein the radiation coming from each of the reflecting sections 1, 2 and 3 is redirected towards the stationary absorber.

In order to succeed in redirecting the solar radiation reflected by all three reflecting sections 1, 2 and 3 onto the stationary absorber when alignment situations such as the one illustrated in FIG. 7 above are reached, the secondary redirecting reflector according to Embodiment #1 is split into three separate secondary reflectors "a", "b" and "c" (See FIGS. 9 and 10). Each one of these is positioned at the precise location in space occupied by their corresponding narrow areas of focus. Such situation is illustrated in FIGS. 9 and 10, wherein the radiation coming from each of the reflecting sections 1, 2 and 3 is redirected towards the stationary absorber. As the incidence angle of the sun changes, the three separate secondary reflectors "a", "b" and "c" spread further apart from each other in order to continually keep tracking the three separate, narrow areas of focus for reflecting sections 1, 2 and 3. This "spreading" aspect is illustrated in FIGS. 9 and 10, with the solar incidence angle on FIG. 10 being shallower than on FIG. 9.

Figure 11:
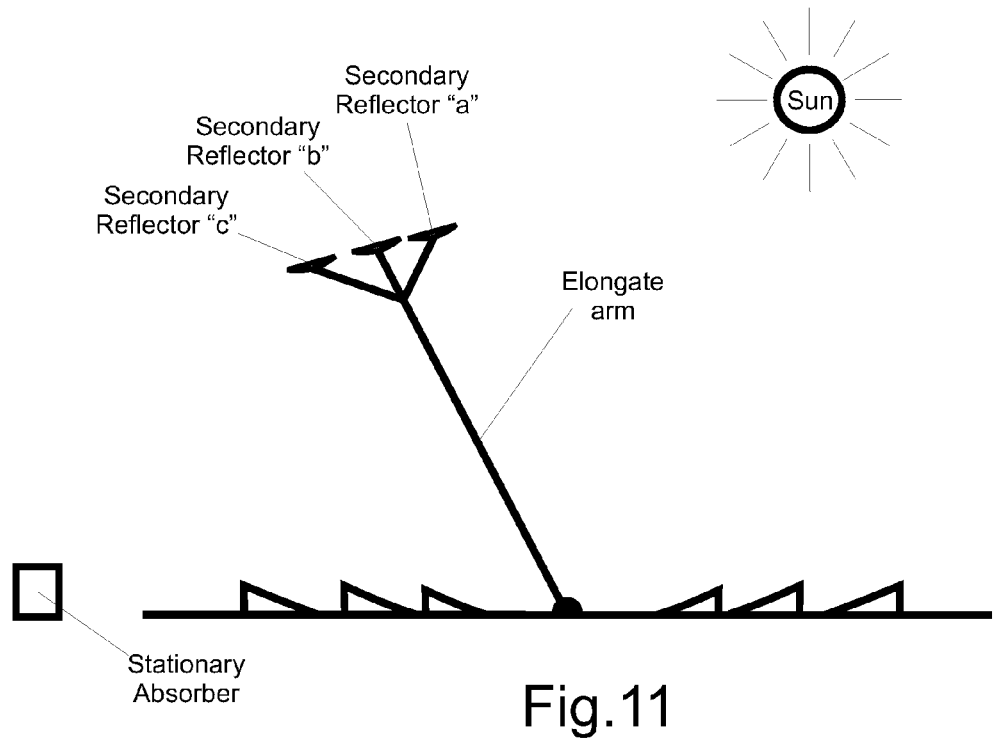
FIG. 11 is a side elevation view of an embodiment of the present invention illustrating the gradually spreading deployment pattern of the three separate secondary reflectors "a", "b" and "c" that would match FIG. 9.
Figure 12:
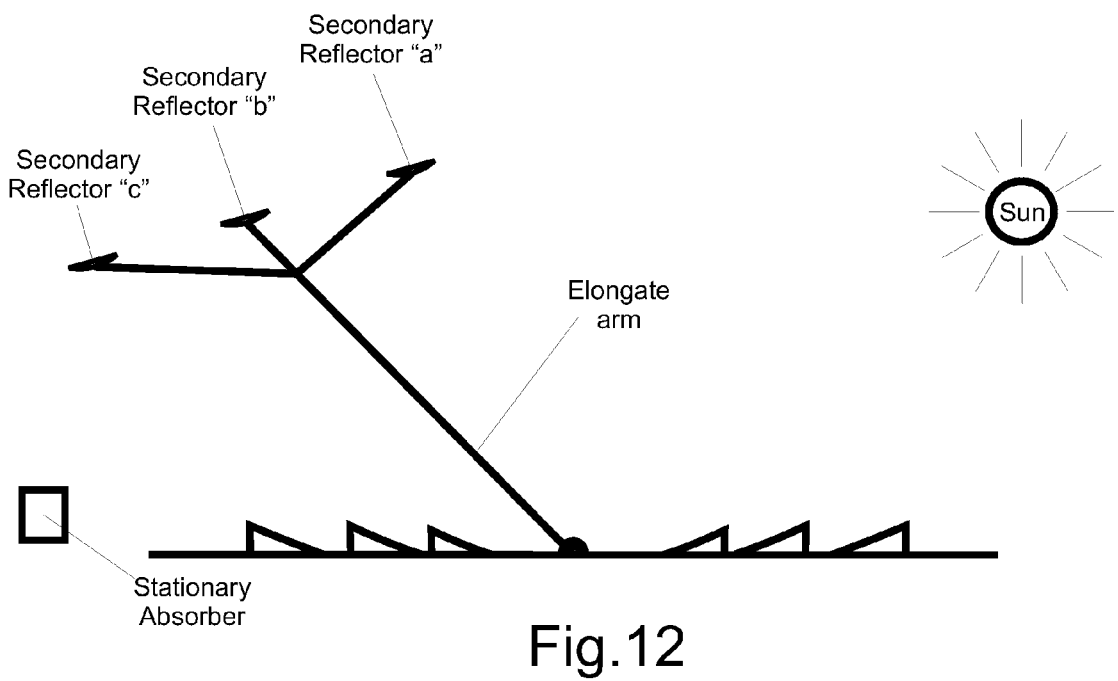
FIG. 12 is a side elevation view of an embodiment of the present invention illustrating the gradually spreading deployment pattern of the three separate secondary reflectors "a", "b" and "c" that would match FIG. 10.

FIGS. 11 and 12 schematically illustrate the gradually spreading deployment pattern of the three separate secondary reflectors "a", "b" and "c" that would match FIGS. 9 and 10. Regarding the physical implementation, the "additional" portions of the secondary redirecting reflector (i.e. the three separate secondary reflectors "a", "b" and "c") could be stored in a stacked configuration when not in use, being deployed by individual telescoping arms when in use.

In an optional embodiment of the present invention, the three separate secondary reflectors "a", "b" and "c" are slidably attached to a supporting rail, which in turn is ball-pivotally connected (i.e. by means of a spherical pivot joint) to the distal end of the elongate supporting arm, as illustrated by FIGS. 13 and 14. The supporting rail can rotate regarding the elongate arm to adjust its own position as required, and each one of the three separate secondary reflectors "a", "b" and "c" can slide over the length of the supporting rail. For example, in FIG. 13 the three separate secondary reflectors "a", "b" and "c" are illustrated close together, whereas in FIG. 14 they are illustrated spaced apart. The combination of movements allowed by these two connections—the ball-pivot connection between the supporting rail and the elongate supporting arm plus the sliding connection between each of the separate secondary reflectors "a", "b" and "c" and their supporting rail—is used to position the secondary reflectors "a", "b" and "c" as required.

In alternative embodiments the elongate supporting arm can be replaced by different structures that perform the same task. In the example illustrated at FIG. 15 a rolling arcuate guide rail supports the supporting rail over which the three separate secondary reflectors "a", "b" and "c" slide. Three-dimensional mobility is provided by a combination of sliding the supporting rail along the extension of the arcuate guide rail and rolling the arcuate guide rail around a pivoting horizontal axis as illustrated.

By means of continuous adjustment of the deployment angle and positioning of the three separate secondary reflectors "a", "b" and "c" the incoming radiation from reflecting sections 1, 2 and 3 can be continually focused on the stationary absorber as the sun runs its course across the sky.

Embodiment #2

Figure 16:
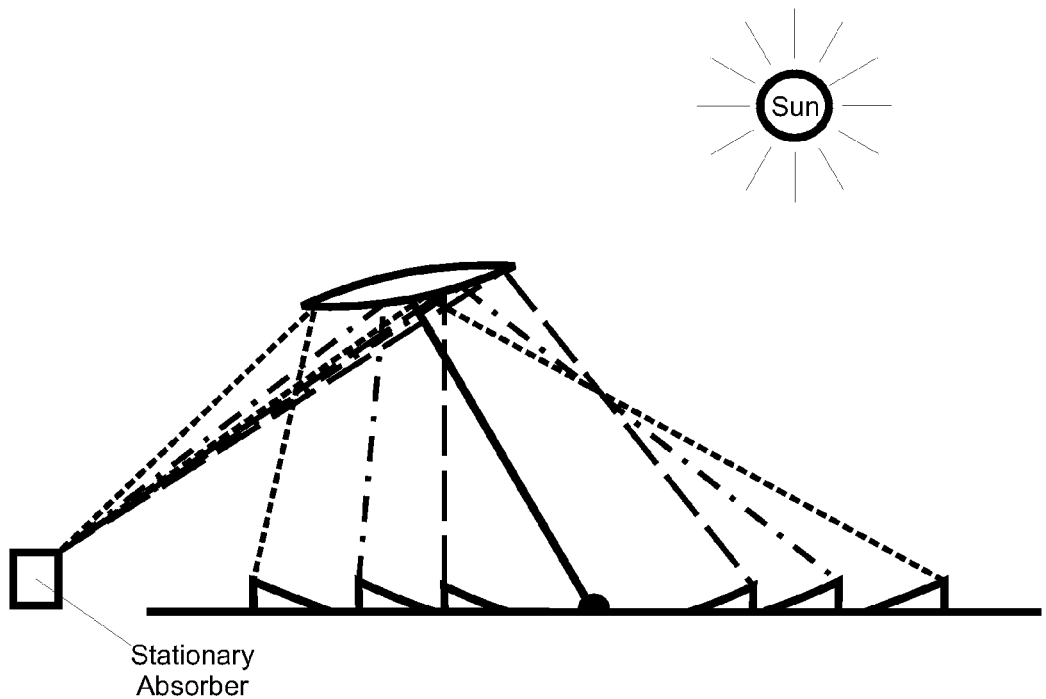
FIG. 16 is a side elevation view of an embodiment of the present invention illustrating a first positional example of an elongated, divergent secondary redirecting reflector that is continually repositioned such that the incoming radiation from reflecting sections 1, 2 and 3 can be continually focused on the stationary absorber as the sun runs its course across the sky.
Figure 17:
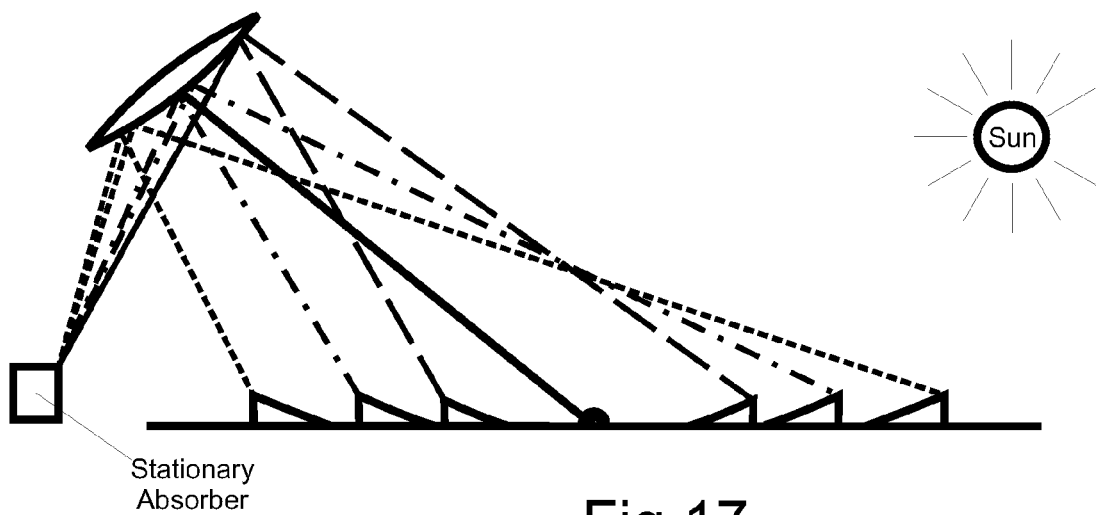
FIG. 17 is a side elevation view of an embodiment of the present invention illustrating a second positional example of an elongated, divergent secondary redirecting reflector that is continually repositioned such that the incoming radiation from reflecting sections 1, 2 and 3 can be continually focused on the stationary absorber as the sun runs its course across the sky.

In order to succeed in redirecting the solar radiation reflected by all three reflecting sections 1, 2 and 3 onto the stationary absorber when alignment situations such as the one illustrated in FIG. 7 above are reached, the secondary redirecting reflector according to Embodiment #2 is given an elongated three-dimensional shape. As illustrated in FIGS. 16 and 17 this elongated, divergent secondary redirecting reflector is long enough and is continually repositioned such that the incoming radiation from reflecting sections 1, 2 and 3 can be continually focused on the stationary absorber as the sun runs its course across the sky. Just like the secondary redirecting reflector originally proposed in the previous patent application U.S. Ser. Ser. No. 12/580,251, this reflector can be tilted regarding its supporting arm so as to aid in the continuous focusing of the incoming radiation as desired. In other words, the secondary reflector is ball-pivotally connected to a mobile element—such as the previously described elongated elongate supporting arm—that moves according to solar tracking data for allowing the secondary reflector to keep its concentrated light output pointed towards the stationary remote absorber while the movement of the sun across the sky causes the area of concentration of the light output by the reflecting sections 1, 2 and 3 to change position.

As the incidence angle of the sun changes, the elongated, divergent secondary redirecting reflector tilts in order to continually keep tracking the three separate, narrow areas of focus for reflecting sections 1, 2 and 3. This tilting aspect is illustrated in FIGS. 16 and 17, with the solar incidence angle on FIG. 17 being shallower than on FIG. 16.

The elongated profile of the secondary redirecting reflector according to Embodiment #2 can be readily appreciated looking at FIG. 16. The secondary redirecting reflector is ball-pivotally connected (i.e. by means of a spherical pivot joint) to the distal end of the elongate supporting arm, and its tilting in different directions allows the positioning of the reflector as required, as illustrated by FIG. 17.

Figure 18:
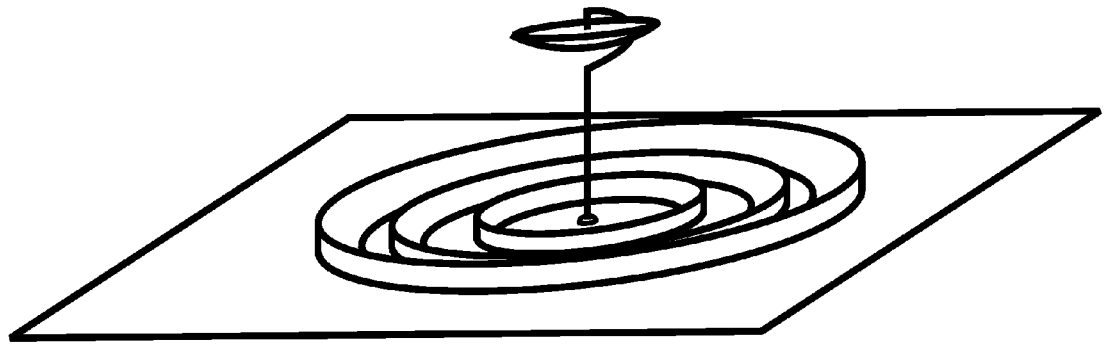
FIG. 18 is a perspective view of an embodiment of the solar concentrator array illustrating a first exemplary position of the secondary redirecting reflector.
Figure 19:
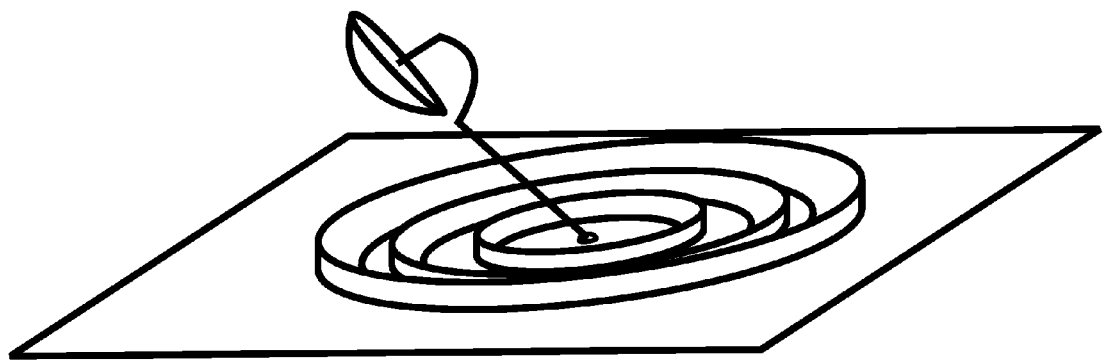
FIG. 19 is a perspective view of an embodiment of the solar concentrator array illustrating a second exemplary position of the secondary redirecting reflector.
Figure 20:
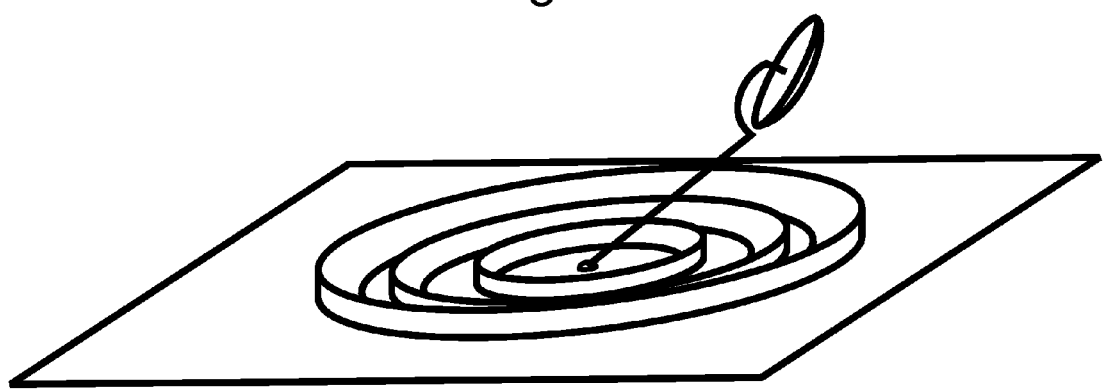
FIG. 20 is a perspective view of an embodiment of the solar concentrator array illustrating a third exemplary position of the secondary redirecting reflector.

The ball-pivot connection allows the secondary redirecting reflector to assume various positions, for example those illustrated in FIGS. 18, 19 and 20.

Embodiment #3

As pointed out before, each of said multiple reflecting sections that make up the primary concentrating reflector redirects the incident solar radiation towards its own narrow area of focus. The various, successive positions occupied in the sky by said narrow area of focus according to the daily and seasonal movement of the sun define a unique focal surface corresponding to each one of said multiple reflecting sections, therefore generating multiple focal surfaces. In the example herein employed to illustrate the working of the present invention, each of the three reflecting sections 1, 2 and 3 that make up the primary concentrating reflector generates its own focal surfaces as the sun runs its course across the sky, so that our example features three individual focal surfaces. Each of said individual focal surfaces can have its shape adjusted by adjusting the primary reflecting section that generates said focal surface. More specifically, the adjusted parameters are the curvature of the parabolic or aspherical cross-section and the incidence angle at the point of incidence of the sun rays. Provided that the adjustment is performed for all the points where the solar rays impinge on the primary reflecting section, any desired shape of focal surface can be achieved. The optical principles involved in such adjustment are well known in the art.

In order to succeed in redirecting the solar radiation reflected by all three reflecting sections 1, 2 and 3 that make up the primary concentrating reflector onto the single stationary absorber when alignment situations such as the one illustrated in FIG. 7 above are reached, the focal surface corresponding to each of the individually shaped reflecting sections 1, 2 and 3 is adjusted such that the average distance between all three surfaces of our example is minimized along the whole working range of the system. In other words, the secondary redirecting reflector according to Embodiment #3 is the same as disclosed in the previous patent application U.S. Ser. Ser. No. 12/580,251, only the three different focal surfaces corresponding to the reflecting sections 1, 2 and 3 have their shape adjusted to provide a compromise, wherein for any given position along the working range of the system the focusing of the light coming from the reflecting sections 1, 2 and 3 onto the secondary redirecting reflector is not perfect for all three sources, but any loss arising from this is offset by the advantage of keeping the secondary redirecting reflector unitary and small. Again it is important to remember that the three different focal surfaces corresponding to the reflecting sections 1, 2 and 3 can have their shape freely adjusted—indeed customized—by adjusting the spatial orientation (which dictates the solar incidence angle) and the curvature of the curved reflector section at each point of the surface of each one of the reflecting sections 1, 2 and 3. The means to achieve this are well known in the art. The design adjustments could result in the reflecting surface of sections 1, 2 and 3 to result aspherical. An aspherical surface is defined as a surface which profile is neither a portion of a sphere nor of a circular cylinder.

Figure 21:
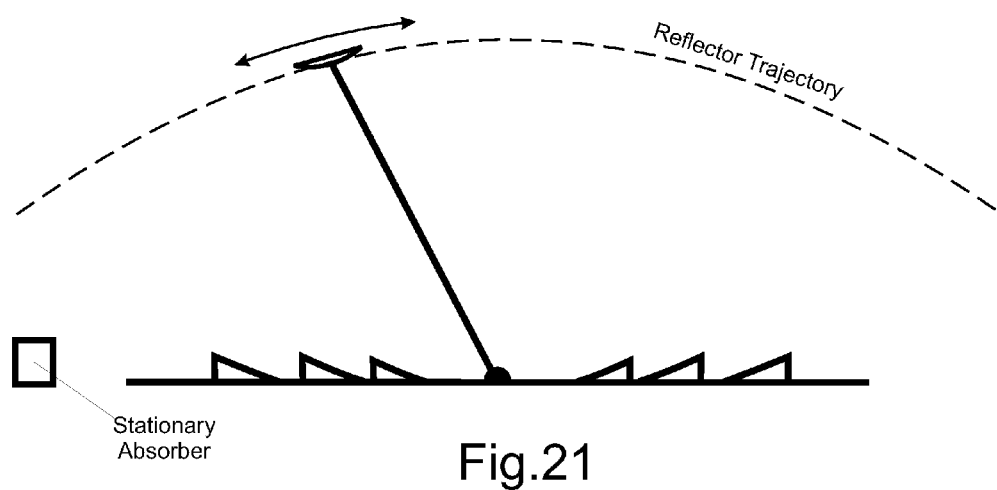
FIG. 21 is a side elevation view of an embodiment of the present invention illustrating the trajectory of the secondary redirecting reflector as the sun runs its course across the sky.
Figure 22:
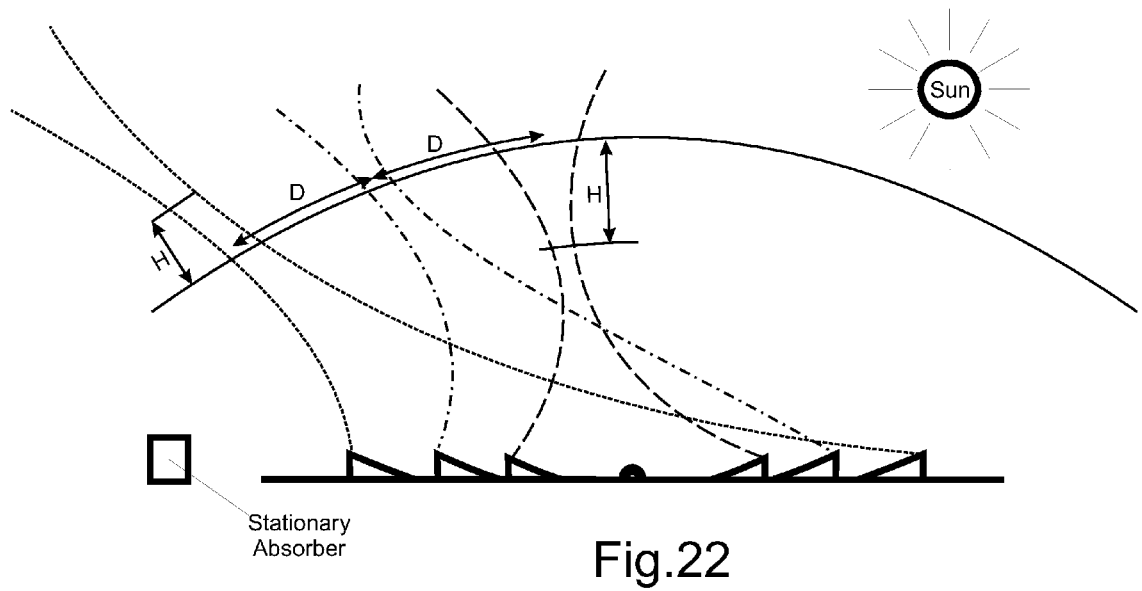
FIG. 22 is a side elevation view of an embodiment of the present invention illustrating the imaginary "focus trunks" resulting for one given position of the sun, intersecting the trajectory of the secondary redirecting reflector at different points.

Let us consider for a moment the trajectory of the secondary redirecting reflector across the sky as illustrated in FIG. 21. Let us also consider the imaginary "focus trunks" illustrated in FIG. 22 that represent the position of the narrow area of focus along the trajectory of the reflected light for one given position of the sun. FIG. 22a illustrates the same elements of FIG. 22, plus the three different focal surfaces corresponding to each of the individually shaped reflecting sections 1, 2 and 3. The criterious adjustment of the shape of these three different focal surfaces corresponding to the reflecting sections 1, 2 and 3 is critical for the performance of the present invention, as will be discussed in the following paragraphs.

FIG. 22 illustrates how the imaginary "focus trunks" resulting for one given position of the sun may intersect the trajectory of the secondary redirecting reflector at different points, with a distance "D" between them which is measured along the length of the trajectory of the secondary redirecting reflector. The distance "D" tends to be magnified for shallower solar incidence angles. Furthermore—and also illustrated in FIG. 22—the portion of each imaginary "focus trunk" that feature the narrowest cross-section may not correspond with the intersection with the trajectory of the secondary redirecting reflector. In fact, there may be a distance "H" between said point of narrowest cross-section of the trunk and the trajectory of the secondary redirecting reflector. For the sake of improving the optical performance of the system, both the distances "D" and "H" should be minimized as much as possible.

It is important to note that the position of the "focus trunks", as well as the values of the distances "H" and "D" vary according to the sun's position, such that for each particular sun position a new set of different "focus trunks" and distances "D" and "H" result.

The minimization of the distance "H" is achieved in the present invention by the Embodiment #3. That is so because by bringing the focal surfaces corresponding to all three individually shaped reflecting sections 1, 2 and 3 closer together along the whole working range of the system, the distance "H" is inevitably minimized, thus increasing the average focal performance for the whole system.

The minimization of the distance "D" is achieved in the present invention by adjusting the spatial orientation (which dictates the solar incidence angle) and the curvature of the curved reflector section at each point of the surface of each one of the reflecting sections 1, 2 and 3. As stated before, the means to achieve this are well known in the art, and said design adjustment could render the reflecting surface of sections 1, 2 and 3 aspherical.

The bottom line is that the design parameters of the reflecting sections 1, 2 and 3 are adjusted to minimize both the distances "D" and "H" between the focal surfaces as illustrated in FIG. 22a, thus ensuring that the incoming radiation from reflecting sections 1, 2 and 3 is continually focused on the stationary absorber with the narrowest possible average focus as the sun runs its course across the sky.

Figure 23:
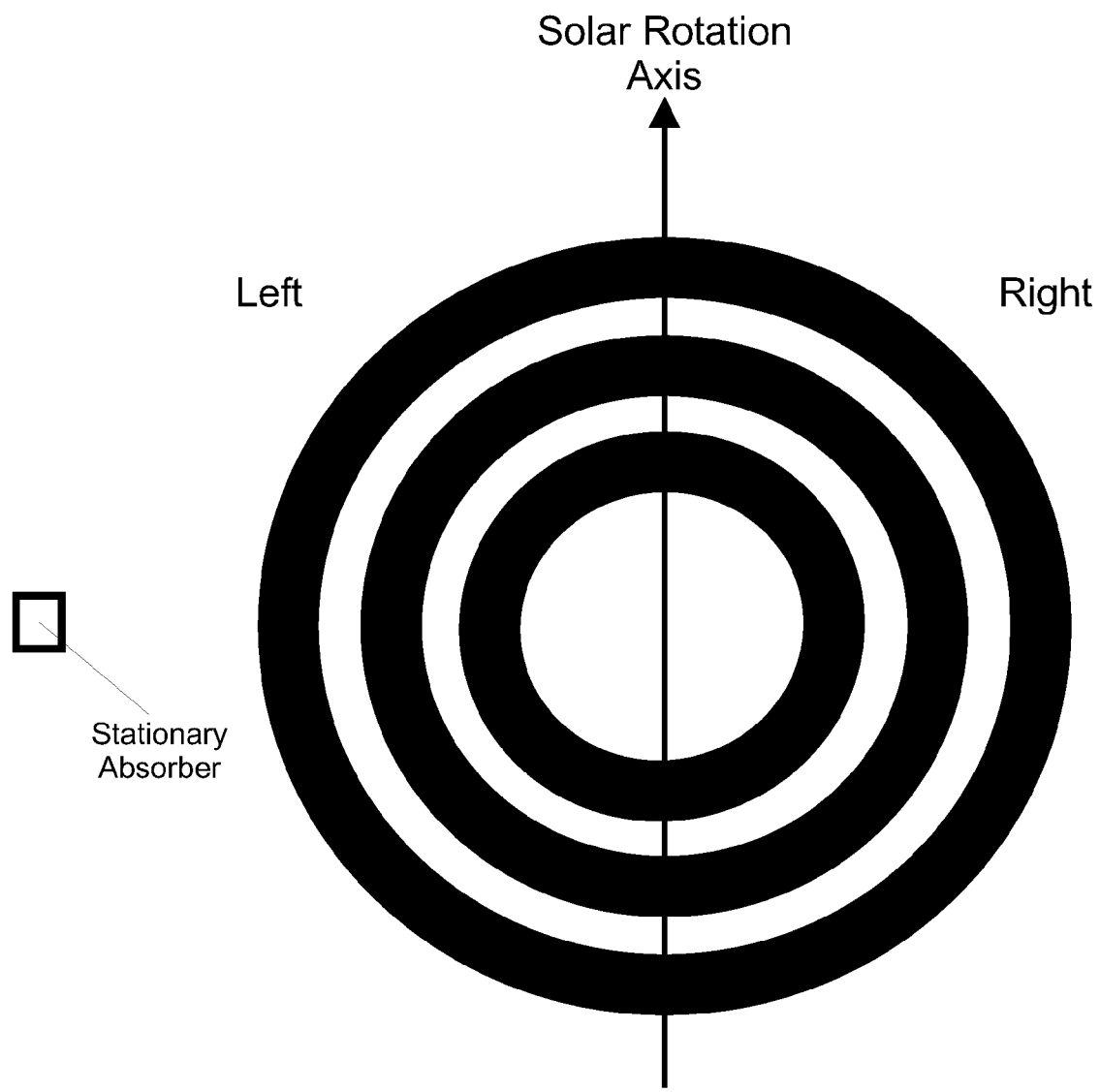
FIG. 23 is a top plan view of an exemplary arrangement of the primary concentrating reflector according to the present invention, illustrating the direction of an imaginary solar rotation axis as projected on the ground.

Another aspect to consider is that the remote absorber is stationary and positioned to one side of the reflecting sections 1, 2 and 3 that form the primary concentrator array. In spite of the seasonal variations of the solar path across the sky over the year, the direction of an imaginary solar rotation axis as projected on the ground remains constant throughout the year. Said rotation axis is illustrated on FIG. 23. For simplicity of description we will herein designate the two halves of the primary reflector as created by the solar rotation axis "Left" and "Right". Assuming as a design directive that the stationary absorber is to be positioned off to one side of said solar rotation axis (in FIG. 23 it is to the left of the axis), it becomes clear that some design feature must be implemented in order to match the symmetric disposition of the reflecting sections 1, 2 and 3 and the asymmetric positioning of the absorber regarding them.

Two different approaches are proposed to achieve this matching: the introduction of design asymmetry between the "Left" and "Right" halves of the primary reflector array, and criterious tilting of the secondary redirecting reflector. These may be used in isolation or optionally be combined to achieve the desired continuous focusing of the concentrated solar light onto the stationary absorber.

Figure 24:
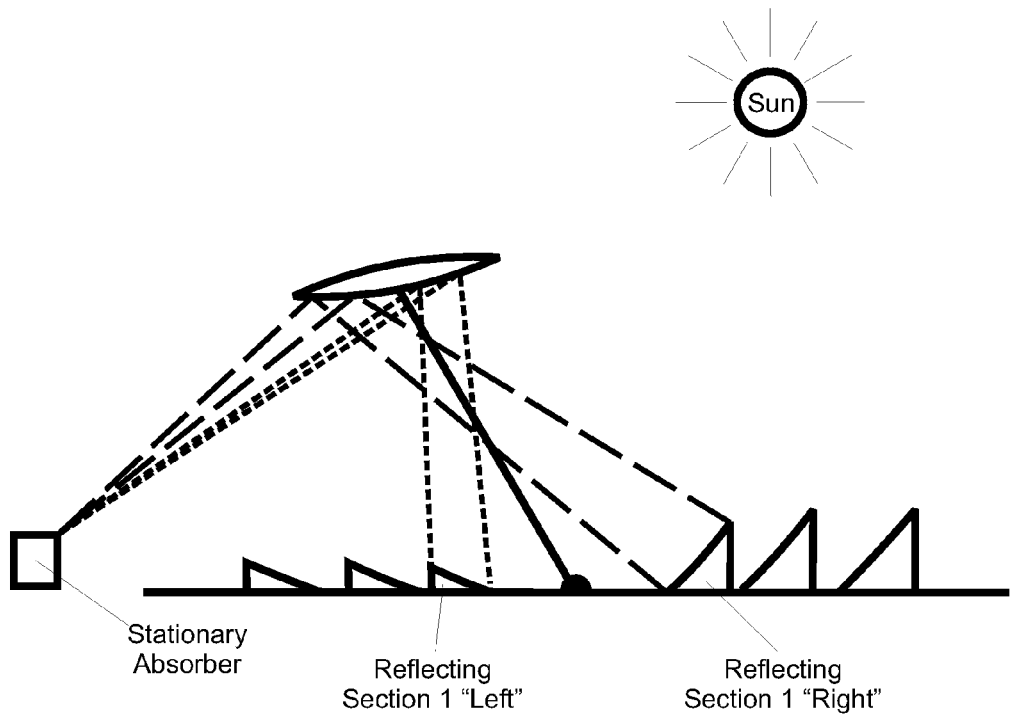
FIG. 24 is a side elevation view of an embodiment of the present invention illustrating the proposed design asymmetry between the "Left" and "Right" halves of the primary reflector array.

The proposed design asymmetry between the "Left" and "Right" halves of the primary reflector array is illustrated in FIG. 24. As the "Right" and "Left" portions of the reflecting sections 1, 2 and 3 incorporate different design angles and thus form different angles with the ground, the light they reflect hit the surface of the secondary redirecting reflector at different spots and at different angles. This is illustrated in FIG. 24 by means of separate illustration of the light coming from the "Right" and "Left" portions of the reflecting section 1 only (the light from reflecting sections 2 and 3 are omitted to simplify the drawing).

The criterious adjustment of this effect is incorporated in the design of the reflecting sections 1, 2 and 3 in such a way that the light coming from both the "Right" and "Left" portions of the reflecting sections ends up being continually focused at the same spot on the stationary absorber as the sun runs its course across the sky.

Figure 25:
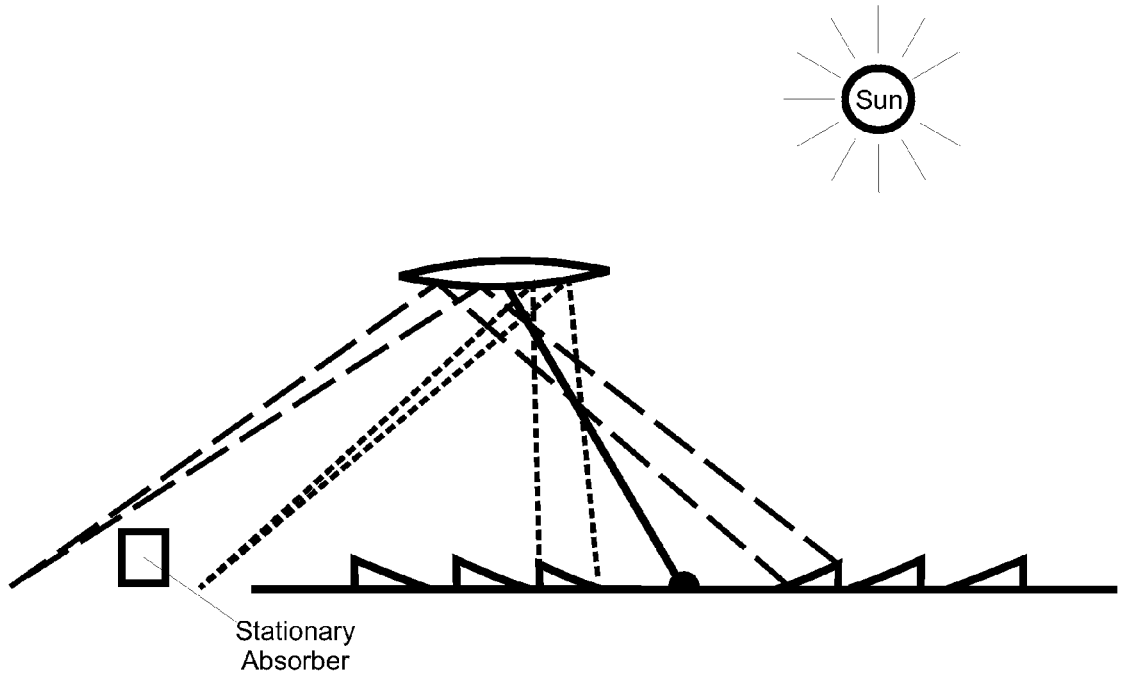
FIG. 25 is a side elevation view of an embodiment of the present invention illustrating the situation resulting in case the asymmetry between the "Left" and "Right" halves of the primary reflector array is not addressed.
Figure 26:
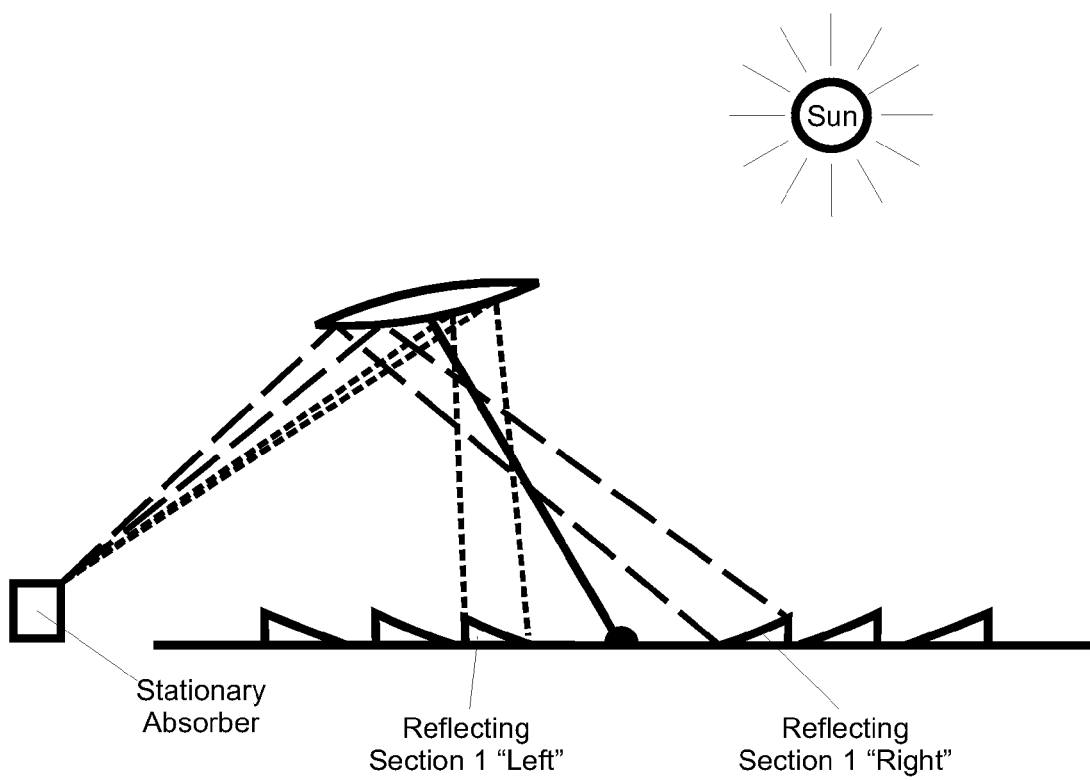
FIG. 26 is a side elevation view of an embodiment of the present invention illustrating the situation resulting once the problem illustrated on FIG. 25 is addressed.

The proposed criterious tilting of the secondary redirecting reflector can be used to achieve much the same effect described in the previous paragraph. If the reflecting sections 1, 2 and 3 are designed as symmetric, the light reflected by their "Right" and "Left" portions hits the surface of the secondary redirecting reflector at different spots. If not rectified, this would cause the "Right" and "Left" portions of the incoming light to end up redirected to separate points on the ground, instead of the desired common focusing on the stationary absorber, resulting in the situation illustrated in FIG. 25. The tilting of the secondary redirecting reflector—or for that matter the introduction of asymmetry in its surface design—can be used to compensate for the fact that the incoming "Right" and "Left" rays hit the reflector at different spots. The tilting of the secondary redirecting reflector—or the introduction of surface asymmetry in it—would result in these different spots to feature the precise inclination required for continually focusing the light output by the secondary redirecting reflector onto the stationary absorber as the sun runs its course across the sky. An example of said situation is illustrated in FIG. 26.

Figure 27:
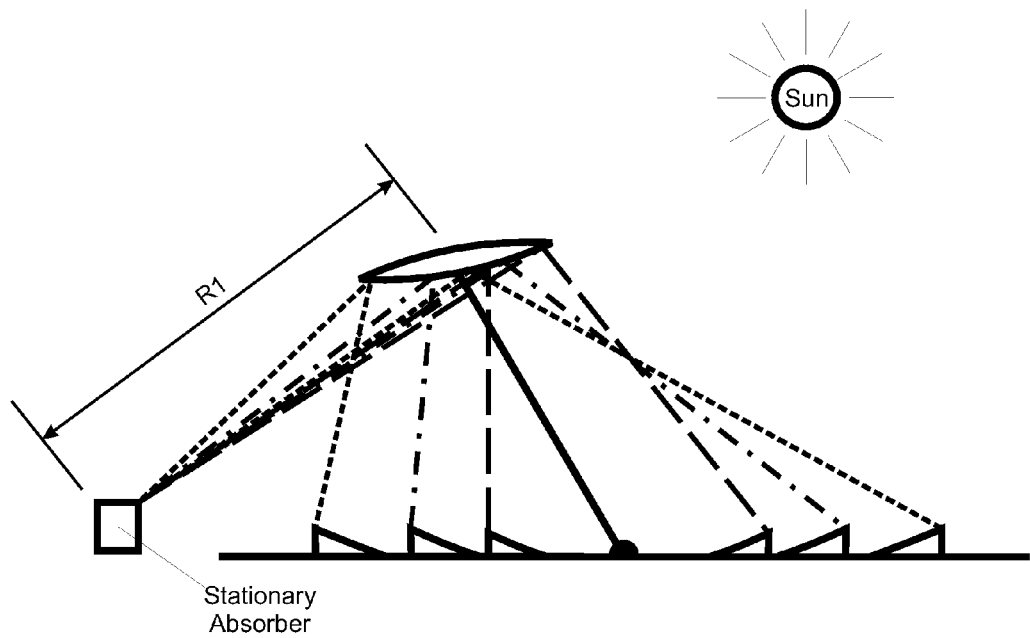
FIG. 27 is a side elevation view of an embodiment of the present invention illustrating a first angular disposition with its associated distance "R" that varies according to the positioning of the secondary redirecting reflector's supporting element.
Figure 28:
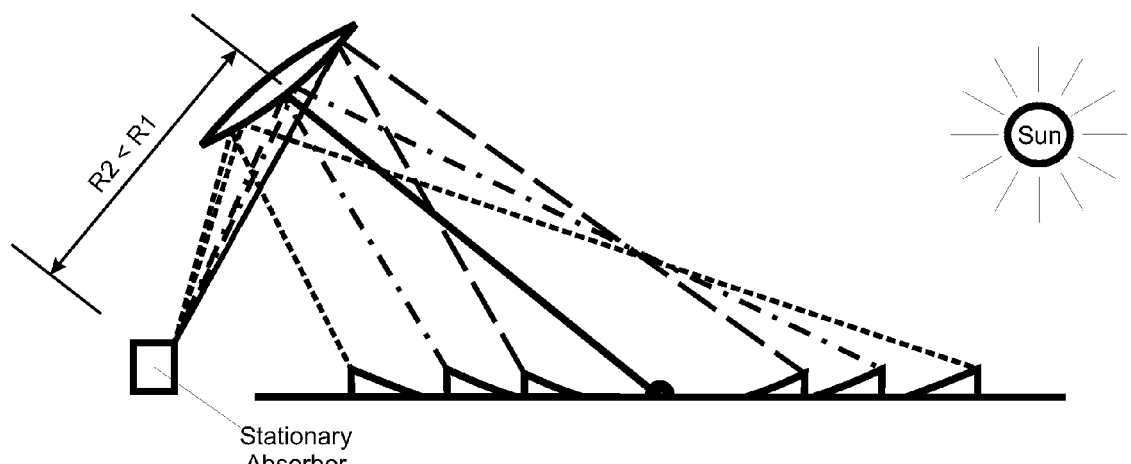
FIG. 28 is a side elevation view of an embodiment of the present invention illustrating a second angular disposition with its associated distance "R" that varies according to the positioning of the secondary redirecting reflector's supporting element.

One final issue to consider is the relation between the degree of divergence of the secondary redirecting reflector and the variation of the distance between said secondary redirecting reflector and the stationary absorber. As illustrated in FIGS. 27 and 28 this distance "R" varies according to the positioning of the secondary redirecting reflector's supporting element. Given that the light output by the secondary redirecting reflector is convergent in its path towards the stationary absorber, the distance "R" determines how much concentrated the light will be upon reaching the stationary absorber. In a similar manner, if we consider that the degree of divergence of the secondary redirecting reflector also determines how much concentrated the light will be upon reaching the stationary absorber, we conclude that said degree of divergence also determines how much concentrated the light will be upon reaching the stationary absorber.

As explained in U.S. application Ser. No. 12/580,251, ideally the light output by the secondary redirecting reflector onto the stationary absorber should reach it as close as possible in a point focus. Ergo, the continuous adjustment of the degree of divergence of the secondary redirecting reflector for each value of the distance "R" illustrated in FIGS. 27 and 28 is critical to ensure the achievement of a focusing as close as possible to a point focus upon reaching the stationary absorber. Said adjustment must be made continually as the sun runs its course across the sky.

Multiple Reflecting Sections Laid on Separate Surfaces

Figure 29:
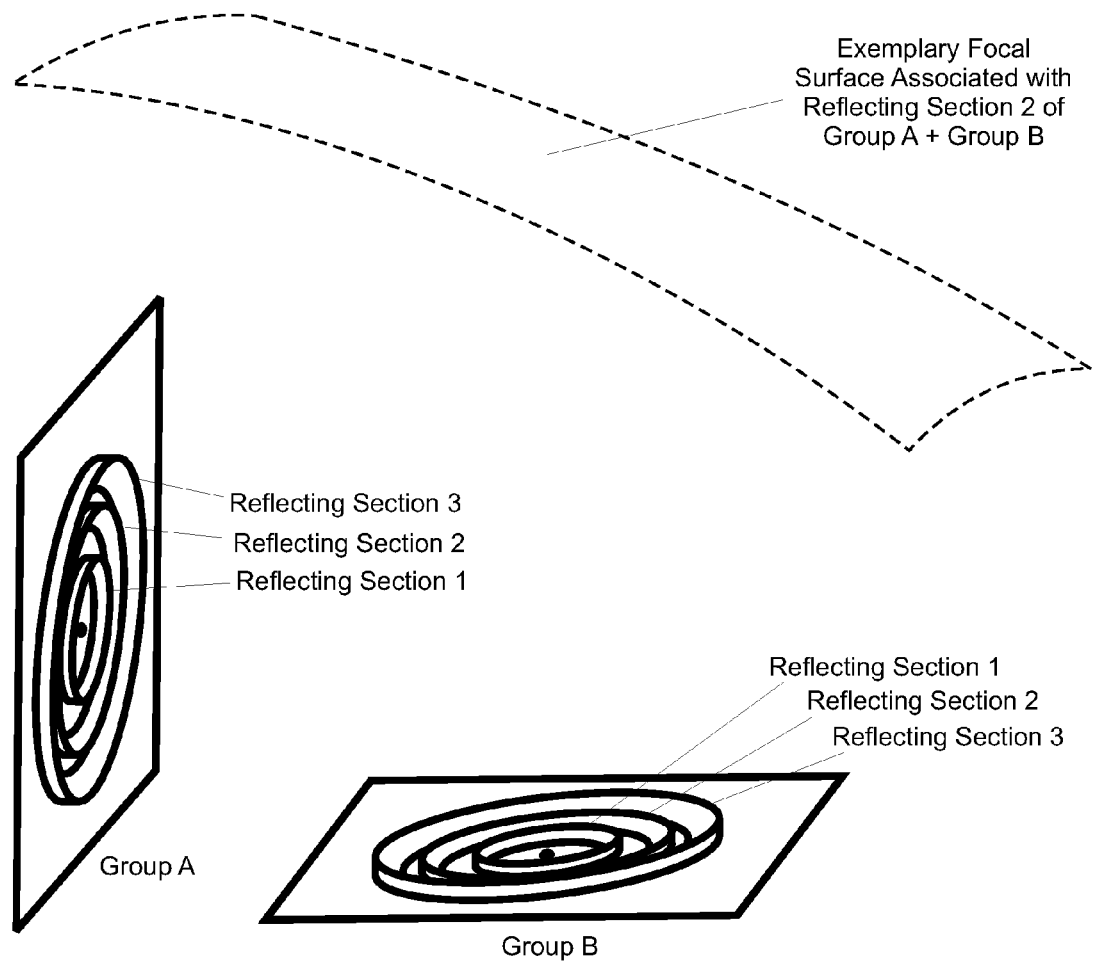
FIG. 29 is a perspective view of an embodiment of the present invention illustrating two independent groups of reflecting sections A and B—each of them comprising three concentric circular reflecting sections 1, 2 and 3—positioned in separate, non-parallel surfaces.

In an optional embodiment of the present invention, two or more separate groups of reflecting sections may be positioned on different locations, yet still cooperate to form one and the same set of focal surfaces. For instance, one group of reflecting sections could be positioned on a floor while a second, cooperating group of reflecting sections could be positioned on a nearby wall. In the non-limiting example illustrated on FIG. 29, two independent groups of reflecting sections A and B—each of them comprising three concentric circular reflecting sections 1, 2 and 3—are positioned in separate, non-parallel surfaces. Although physically spread apart, each of the reflecting sections in Group A cooperate with its equivalent section in Group B to generate one and the same focal surface. In this example, the focal surface resulting from the cooperation between reflecting section 2 of Group A and reflecting section 2 of Group B features exactly the same characteristics and shape adjustability previously described for single groups of reflecting sections. The only difference is that both Group A and Group B contribute to the amount of light concentration achieved in each point along said focal surface.

Modular Tiles

As described in U.S. application Ser. No. 12/580,251, the primary concentrating reflector array may be manufactured into modular tiles as seen on FIG. 30. In one embodiment of the present invention, each of these modularized tiles contains one or more reflecting elements as described above, being several of these modularized tiles assembled together over a surface to form the primary concentrating reflector array. Closer examination of the assembled primary concentrating reflector array will reveal that the physical boundaries between neighboring modular tiles coincides with a separation line between different reflecting elements.

Figure 30:
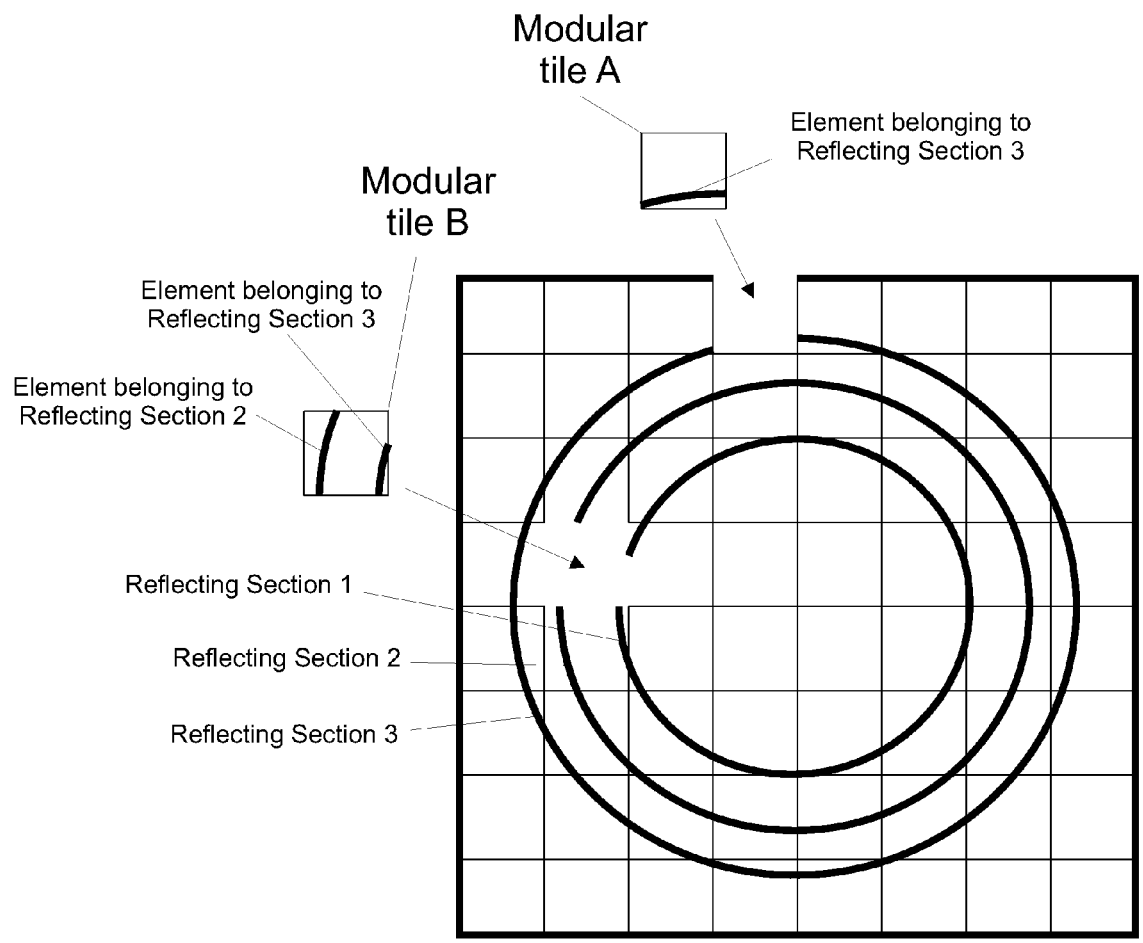
FIG. 30 is a top plan view of an embodiment of the primary concentrating reflector according to the present invention where the primary concentrating reflector array is manufactured into modular tiles.

In the non-limitative example illustrated on FIG. 30 it is possible to identify two different modular tiles A and B. Modular tile A contains one reflecting element that, once the modules are assembled together to form the primary concentrating reflector array, will form part of reflecting section 3. In contrast, Modular tile B contains two reflecting elements; one that will form part of reflecting section 2 and one that will form part of reflecting section 3. Once the multiple modularized tiles are assembled together to form the primary concentrating reflector array, the reflecting element of Modular tile A that forms part of reflecting section 3 will cooperate with the reflecting element of Modular tile B that also forms part of reflecting section 3 to form the focal surface 3 associated with said reflecting section 3. Extrapolation of this example aids in understanding one of the features of the present invention, namely that reflective elements positioned on a first modular tile may cooperate with reflective elements positioned on a second modular tile to form a reflecting section that will generate one and the same focal surface by concentrating the incoming solar radiation in a narrow area of focus.

While this invention has been particularly shown and described with reference to an exemplary embodiment, it will be understood by those skilled in the art that various changes in form and detail may be made therein without departing from the spirit and scope of the invention. The number of reflecting sections may be changed; these may be made non-circular, may be split into various sections, etc. The invention in its broadest, and more specific aspects, is further defined in the claims which now follow.

I claim:

1. A method of fabricating a solar concentrator comprising:
   arranging a plurality of curved independent reflecting sections concentrically to form a primary reflector, each reflecting section having a reflecting surface that is stationary relative to the Earth wherein each of the reflecting sections is oriented independently of the other reflecting sections such that each section redirects incident solar radiation towards an associated target area, wherein a target area associated with a first of said reflecting sections moves relative to a target area associated with a second of said reflecting sections as an angle of incidence of solar radiation relative to the concentrator changes;
   positioning a secondary reflector at each of said associated target area, each of said secondary reflector redirecting solar radiation from an associated one of said independent reflecting sections towards a remote absorber, each of said secondary redirecting reflector being movable relative to the primary reflector; and
   repositioning each secondary reflector with their associated target area such that the redirection of the solar radiation from each of said independent reflecting sections to the remote absorber is maintained as said angle of incidence of solar radiation relative to the concentrator changes.

2. A method according to claim 1, wherein the reflecting sections of the primary concentrating reflector configure an aspherical surface.

3. A method according to claim 1, wherein continuously repositioning each of the secondary reflectors maintains the radiation reflected from the plurality of reflecting sections of the primary concentrating reflector focused on the remote absorber as an angle of incidence of the solar radiation relative to the concentrator system changes.

4. A method according to claim 1, wherein arranging the primary concentrating reflector comprises arranging the reflective sections in individual modules that can be assembled together to form the primary reflector.

5. A method according to claim 4, wherein each of said individual modules includes portions of more than one reflective section.

6. A method according to claim 4, wherein a reflective surface located on a first of said individual modules cooperates with a reflective surface on a second of said individual modules to form a single reflective surface.

7. A method according to claim 1, wherein repositioning comprises providing a repositioning mechanism comprising an elongate arm that has its distal end connected to the secondary reflector and its proximal end connected to a surface.

8. A method according to claim 7, wherein the elongate arm can telescope for selectively adjusting a distance between its proximal and distal ends.

9. A method according to claim 1, wherein providing a repositioning mechanism comprises providing a repositioning mechanism that can move each of the secondary reflector in a direction perpendicular to the surface of the Earth.

10. A method according to claim 1, wherein repositioning comprises providing a repositioning mechanism comprising an arcuate guide rail with both ends pivotally connected to a surface for tilting the arcuate guide rail and positioning each of the secondary reflector, each of the secondary reflector being selectively slidable along the length of the arcuate guide rail.

11. A method according to claim 1, wherein each of the reflective sections of the primary reflector produces a focal surfaces of solar radiation at the associated target area, and wherein the reflective sections are configured so as to minimize an average distance between each of the focal surfaces for all solar positions within the system's working range.

12. A method according to claim 1, further comprising controlling the repositioning mechanism to continually change a deployment angle and position of each of the secondary reflector as said angle of incidence of the solar radiation relative to the concentrator array changes.

13. A method according to claim 1, wherein arranging a plurality of reflecting sections comprises organizing the reflecting sections in groups that cooperate with one another to produce a respective common focal surface of solar radiation at their associated target area.

14. A method according to claim 1, wherein said plurality of immovable independent reflecting sections are fixed such that they follow a contour of the support surface.

15. A method according to claim 4, wherein each of said individual modules includes a plurality of reflective sections.

16. A method of fabricating a solar concentrator comprising:
   providing a plurality of modular reflecting tiles wherein at least one of the reflecting tiles comprising a plurality of reflective surfaces;
   assembling the plurality of modular reflecting tiles into a primary reflector on a support surface wherein said plurality of reflective surfaces remain stationary relative to the Earth, the assembled primary reflector comprising a plurality of concentric curved reflecting sections oriented independently of one another such that each section redirects incident solar radiation towards an associated target area and wherein a target area associated with a first of said reflecting sections moves relative to a target area associated with a second of said reflecting sections as an angle of incidence of solar radiation relative to the concentrator changes;
   positioning a secondary reflector at each respective common target area, each of said secondary reflector redirecting solar radiation towards a remote absorber, each of said secondary reflector being movable relative to the primary reflector; and
   repositioning each secondary reflector with their associated target area such that the redirection of the solar radiation from each of said reflecting sections to the remote absorber is maintained as an angle of incidence of the solar radiation relative to the concentrator changes.

17. A method of making a solar concentrator array, the method comprising:
  locating a primary concentrating reflector comprising reflective surfaces that remain stationary relative to the Earth by fixing a plurality of concentric curved reflecting sections that make up the primary reflector to a support surface such that they follow a contour thereof;
  orienting each of the multiple reflecting sections independently of the other reflecting sections such that each of the multiple reflecting sections redirects incident solar radiation towards an associated target area wherein an intensity of the redirected solar radiation within each associated common target area is uneven and varies between a region of maximum intensity and regions of lesser intensity and wherein a target area associated with a first of said reflecting sections moves relative to a target area associated with a second of said reflecting sections as an angle of incidence of solar radiation relative to the concentrator array changes;
  positioning a secondary reflector at each associated target area that redirects solar radiation from an associated one of the multiple reflecting sections towards a remote absorber, each of said secondary redirecting reflector being movable relative to the primary reflector; and
  providing a repositioning mechanism that moves each secondary reflector to a position coincident with the region of maximum intensity of their associated one of the multiple reflecting sections.

* * * * *